United States Patent
Liu et al.

(10) Patent No.: US 9,054,048 B2
(45) Date of Patent: *Jun. 9, 2015

(54) NH3 CONTAINING PLASMA NITRIDATION OF A LAYER ON A SUBSTRATE

(75) Inventors: Wei Liu, San Jose, CA (US); Malcolm J. Bevan, Santa Clara, CA (US); Christopher S. Olsen, Fremont, CA (US); Johanes Swenberg, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/541,941

(22) Filed: Jul. 5, 2012

(65) Prior Publication Data

US 2013/0012032 A1   Jan. 10, 2013

Related U.S. Application Data

(60) Provisional application No. 61/504,685, filed on Jul. 5, 2011.

(51) Int. Cl.
*H01L 21/31* (2006.01)
*H01L 21/469* (2006.01)
*H01L 21/3105* (2006.01)
*H01L 21/02* (2006.01)

(52) U.S. Cl.
CPC ....... *H01L 21/3105* (2013.01); *H01L 21/02148* (2013.01); *H01L 21/02164* (2013.01); *H01L 21/02181* (2013.01); *H01L 21/02332* (2013.01); *H01L 21/0234* (2013.01)

(58) Field of Classification Search
CPC .................................................. H01L 21/3105
USPC ......... 438/287, 591, 769, 775–777, 786, 792; 257/411, E21.268, E21.269, E21.292, 257/E21.293, E21.302
See application file for complete search history.

(56) References Cited

U.S. PATENT DOCUMENTS

| | | | |
|---|---|---|---|
| 6,094,334 A | 7/2000 | Bedi et al. | |
| 6,110,842 A * | 8/2000 | Okuno et al. | 438/776 |
| 6,303,895 B1 | 10/2001 | Husain et al. | |
| 6,610,615 B1 | 8/2003 | McFadden et al. | |
| 6,649,538 B1 * | 11/2003 | Cheng et al. | 438/775 |
| 6,716,695 B1 * | 4/2004 | Hattangady et al. | 438/240 |
| 6,951,821 B2 | 10/2005 | Hamelin et al. | |
| 7,179,754 B2 | 2/2007 | Kraus et al. | |
| 7,226,874 B2 | 6/2007 | Matsuyama et al. | |

(Continued)

OTHER PUBLICATIONS

U.S. Appl. No. 12/748,523, filed Mar. 29, 2010, Olsen et al.

(Continued)

*Primary Examiner* — Mary Wilczewski
*Assistant Examiner* — Erik T Peterson
(74) *Attorney, Agent, or Firm* — Moser Taboada; Alan Taboada

(57) ABSTRACT

Methods and apparatus for forming nitrogen-containing layers are provided herein. In some embodiments, a method includes exposing a first layer of a substrate to a plasma formed from a process gas comprising predominantly a mixture of ammonia ($NH_3$) and a noble gas, wherein ammonia is about 0.5 to about 15 percent of the process gas; and maintaining the process chamber at a pressure of about 10 mTorr to about 80 mTorr while exposing the first layer to the plasma to transform at least an upper portion of the first layer into a nitrogen-containing layer.

16 Claims, 4 Drawing Sheets

(56) References Cited

U.S. PATENT DOCUMENTS

| | | |
|---|---|---|
| 7,232,772 B2 | 6/2007 | Matsuyama et al. |
| 7,294,581 B2 | 11/2007 | Iyer et al. |
| 7,393,787 B2 | 7/2008 | Niimi et al. |
| 7,416,995 B2 | 8/2008 | Iyer et al. |
| 7,439,121 B2 | 10/2008 | Ohmi et al. |
| 7,465,669 B2 | 12/2008 | Iyer et al. |
| 7,514,373 B2 * | 4/2009 | Kraus et al. .......... 438/775 |
| 7,629,270 B2 | 12/2009 | Swerts et al. |
| 7,645,709 B2 | 1/2010 | Chua et al. |
| 2004/0115407 A1 * | 6/2004 | Cohen et al. .......... 428/209 |
| 2005/0164523 A1 | 7/2005 | Sugawara et al. |
| 2006/0019033 A1 | 1/2006 | Muthukrishnan et al. |
| 2006/0043065 A1 | 3/2006 | Buchberger, Jr. et al. |
| 2006/0094192 A1 * | 5/2006 | Yang et al. .......... 438/287 |
| 2007/0049043 A1 * | 3/2007 | Muthukrishnan et al. .... 438/758 |
| 2007/0093012 A1 | 4/2007 | Chua et al. |
| 2007/0111458 A1 | 5/2007 | Sato et al. |
| 2007/0204959 A1 * | 9/2007 | Nakanishi et al. ....... 156/345.36 |
| 2009/0035927 A1 | 2/2009 | Olsen et al. |
| 2009/0233453 A1 | 9/2009 | Mani et al. |
| 2010/0062603 A1 | 3/2010 | Ganguly et al. |
| 2010/0248497 A1 * | 9/2010 | Bevan et al. .......... 438/786 |

OTHER PUBLICATIONS

S. A. Nikiforov, et al., "Large Volume ICP Sources for Plasma-Based Accelerators", Proceedings of APAC 2004, Gyeongju, Korea, pp. 693-685.

Tomasz Bieniek, et al., "Ultra-Shallow Nitrogen Plasma Implantation for Ultra-Thin Silicon Oxynitride ($SiO_xN_y$) Layer Formation", Journal of Telecommunications and Information Technology, Jan. 2005, pp. 70-75.

B. J. Kniknie, et al., "Langmuir Probe Measurements in Inductively Coupled Argon and Ammonia Plasmas", XXVIIth ICPIG, Eindhoven, the Netherlands, Jul. 18-22, 2005.

* cited by examiner

NH3 CONTAINING PLASMA NITRIDATION OF A LAYER ON A SUBSTRATE

CROSS-REFERENCE TO RELATED APPLICATIONS

This application claims benefit of U.S. provisional patent application Ser. No. 61/504,685, filed Jul. 5, 2011, which is herein incorporated by reference.

FIELD

Embodiments of the present invention generally relate to semiconductor processing, and more particularly to methods for forming nitrogen-containing layers.

BACKGROUND

The scaling of semiconductor devices, such as dynamic random access memory (DRAM), logic devices, and the like, may be limited by gate leakage ($J_g$). For example, as thickness of a gate dielectric layer is scaled, current may leak between the channel and the gate of a transistor device causing device failure. The gate leakage may be reduced by incorporating nitrogen into the gate dielectric layer. For example, a gate dielectric layer at the 32 nm node may comprise silicon oxynitride (SiON), where the presence of nitrogen reduces gate leakage in the device.

Typically, nitrogen is incorporated into the gate dielectric layer by a plasma nitridation process that provides for gate leakage reduction at the expense of other desired properties, for example, flat band voltage ($V_{fb}$), threshold voltage ($V_t$), and mobility. For example, increased nitrogen content in the gate dielectric layer may undesirably increase $V_t$ and excessively decrease mobility. Further, oxygen may diffuse from the gate dielectric layer under typical processing conditions, thus further reducing device performance, for example by degrading the dielectric properties of the gate dielectric layer.

Accordingly, there is need in the art for a method of forming gate dielectric layers having reduced gate leakage at smaller device nodes without reducing device performance.

SUMMARY

Methods and apparatus for forming nitrogen-containing layers are provided herein. In some embodiments, a method includes exposing a first layer of a substrate to a plasma formed from a process gas comprising predominantly a mixture of ammonia ($NH_3$) and a noble gas, wherein ammonia is about 0.5 to about 15 percent of the process gas; and maintaining the process chamber at a pressure of about 10 mTorr to about 80 mTorr while exposing the first layer to the plasma to transform at least an upper portion of the first layer into a nitrogen-containing layer The preceding brief summary is not intended to be limiting of the scope of the present invention. Other and further embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
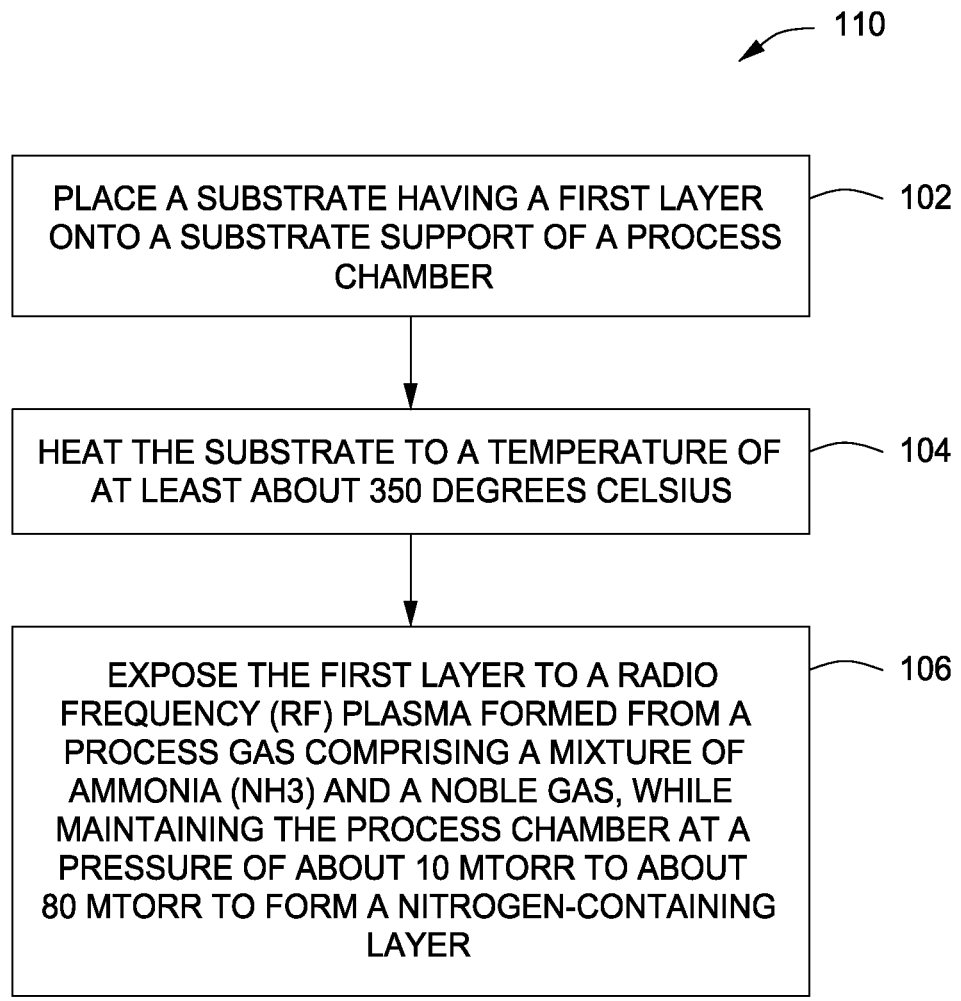
FIG. 1 is a flow chart depicting a method of forming a nitrogen-containing layer in accordance with some embodiments of the invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for forming nitrogen-containing layers are provided herein. The inventive methods and apparatus may advantageously provide improved nitridation of a target layer (e.g., a first layer) for example, by facilitating increased nitrogen content, and improved oxygen retention at an interface between the target layer and another device layer, for example, a polysilicon gate.

FIG. 1 depicts a nitridation process 100 for forming a nitrogen-containing layer in accordance with some embodiments of the present invention. Generally, the process 100 includes providing a partially fabricated semiconductor structure including a substrate having a first layer disposed thereon. The semiconductor structure may be a partially fabricated semiconductor device such as Logic, DRAM, or Flash memory devices. The nitrogen-containing layer formed by this process may be one or more of a gate dielectric layer, a tunnel oxide layer, a spacer layer, or any suitable layer of a semiconductor structure that may benefit from nitridation, for example, to reduce junction leakage, gate leakage, or the like.

The process 100 is described herein with respect to the partially fabricated semiconductor structure depicted in FIGS. 2A-D, which respectively depict stages of fabrication of a semiconductor structure including a first layer formed over a substrate. The nitridation process 100 may be performed in any suitable plasma reactor, for example, such as those reactors configured to provide an inductively coupled, capacitively coupled plasma, or remote plasmas, or other plasma types. Embodiments of suitable plasma reactors that may be utilized with the inventive methods are described below with respect to FIG. 3. The plasma reactor may be utilized alone or, more typically, as a processing module of an integrated semiconductor substrate processing system, or cluster tool, such as a CENTURA® DPN Gate Stack integrated semiconductor wafer processing system, available from Applied Materials, Inc. of Santa Clara, Calif. Other tools, including those available from other manufacturers, may also be used.

Figure 2A:
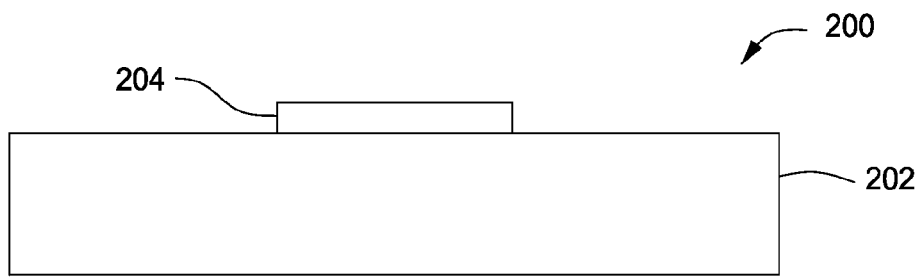
FIGS. 2A-D depict stages of fabricating a gate dielectric layer in accordance with some embodiments of the invention.
Figure 2B:
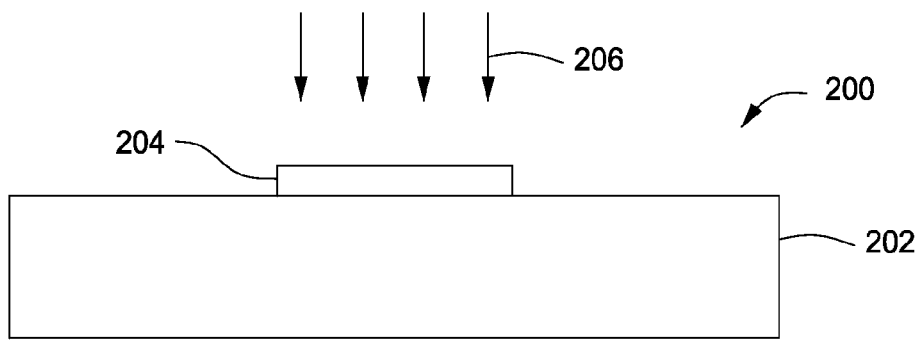

The process 100 begins at 102, where a substrate 202 is provided having a first layer 204 to be nitridized disposed thereon, as shown in FIG. 2A. The substrate 202 and the first layer 204 may be part of a completely or partially fabricated semiconductor device 200. The substrate 202 may have various dimensions, such as 200 or 300 mm diameter wafers, as well as rectangular or square panels. The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

The semiconductor device 200 may be completely or partially formed upon the substrate 202 and includes at least the first layer 204 to be nitridized. The semiconductor device 200 (when completed) may be, for example, a field effect transistor (FET), dynamic random access memory (DRAM), a flash memory device, a 3D FINFET device, or the like. The first layer 204 may be, for example, utilized as a gate dielectric layer of a transistor device, a tunnel oxide layer in a flash memory device, a spacer layer atop a gate structure, an inter-poly dielectric (IPD) layer of a flash memory device, or the like. The first layer 204 may have any thickness suitable in accordance with the particular application for which the first layer 204 may be utilized. For example, the first layer 204 may have a thickness of about 0.5 to about 10 nm. The first layer 204 may comprise an oxide layer, such as silicon oxide ($SiO_2$), hafnium oxide ($HfO_2$), hafnium silicate ($HfSiO_x$), or any suitable oxide layer used in a semiconductor device and requiring nitridation. For example, in some embodiments, the oxide layer may be a native oxide layer, or formed by any suitable oxidation process including the oxidation process discussed below. The first layer 204 need not be limited to an oxide layer, and other suitable layers may benefit from the inventive methods disclosed herein. For example, other suitable embodiments of the first layer 204 may include other silicon-containing layers such as SiC, or the like. The layer 204 can also be a stack of layers, such as a first sub-layer of $SiO_2$ and a second sub-layer of $HfO_2$ or a first sub-layer of $SiO_2$ and a second sub-layer of $HfSiO_x$, or the like.

Next, at 104, the substrate 202 may be heated prior to and during nitridation. Heating the substrate 202 may facilitate providing increased nitrogen content into the first layer 204 and improved device properties. For example, heating the substrate 202 to a temperature of at least about 250 degrees Celsius, or at least about 350 degrees Celsius may facilitate increased nitrogen content (e.g., an atomic percentage content of about 5 to about 35) in the first layer 204. In some embodiments, the substrate may be heated to a temperature of about 250 to about 550 degrees Celsius, or in some embodiments, about 350 to about 450 degrees Celsius. The actual maximum substrate temperature may vary based upon hardware limitations and/or the thermal budget of the substrate being processed.

In embodiments where the first layer 204 is an oxide layer, the increased temperature may advantageously facilitate less evolution of oxygen from the layer (e.g., less than about 20%) and further, accumulation of oxygen at an interface of the first layer 204 and the substrate 202. In some embodiments, the substrate 202 is heated to about 250 to about 550 degrees Celsius. In some embodiments where the first layer 204 is an oxide layer, the substrate 202 may be heated to about 300 to about 550 degrees Celsius, or to about 350 to about 500 degrees Celsius.

In some embodiments, the substrate 202 may be positioned in the reactor such that heat transfer to the substrate is maximized, for example, between the substrate 202 and a substrate support on which the substrate 202 rests during the nitridation process 100. As such, the substrate 202 may be secured to the substrate support using a chucking device, such as an electrostatic chuck (ESC), a vacuum chuck, or other suitable device. Chucking the substrate 202 may advantageously facilitate reproducible heat transfer even at low pressures (the process pressure region), for example, at about 4 mTorr to about 1 Torr, or at about 10 to about 80 mTorr, at about 10 to about 40 mTorr, or at about 10 to about 20 mTorr. Optionally, in embodiments where an electrostatic chuck is provided to secure the substrate 202, a second plasma may be formed above the substrate 202 to facilitate stabilization of the substrate temperature as the substrate is chucked. For example, the second plasma may be formed from a non-reactive gas including at least one of argon (Ar), helium (He), krypton (Kr), xenon (Xe), or the like, to preheat the substrate 202 such that upon chucking the substrate 202 to the substrate support and extinguishing the plasma, the substrate 202 does not experience a dramatic change in temperature which could lead to process variation and/or wafer breakage. As used herein, non-reactive gases include gases that do not substantially react with the substrate (e.g., do not substantially deposit upon or etch the substrate).

The substrate 202 may be heated by any suitable heating mechanism capable of increasing and maintaining the substrate temperature at about 250 degrees Celsius or greater or, in some embodiments, at about 350 degrees Celsius or greater. Suitable heating mechanisms can include resistive heating, radiative heating or the like. For example, and as discussed below in embodiments of the reactor 300, one or more resistive heaters may be disposed in a substrate support for providing heat to the substrate 202. Alternatively, the substrate may be heated, for example, by one or more lamps or other energy sources disposed above and/or below the substrate 202.

In one heating approach, the heater elements are embedded in the electrostatic chuck, so that the substrate is directly heated from the electrostatic chuck. Several advantages may arise from such approach: (1) the substrate can be maintained at a constant temperature during the entire process as long as it is chucked, even though the process pressure is as low as 4 mTorr; (2) process results (nitrogen dose and percentage of nitrogen incorporated by mass (N %)) can be reproducible from substrate to substrate due to the tight control on the substrate temperature during the process; and (3) the within-substrate nitridation uniformity pattern can be altered (e.g., compensated for) by carefully designed heating uniformity pattern in the heater elements of the electrostatic chuck, or by providing multi-zone heater elements having independent control.

In the case of using an electrostatic chuck heater, due to the nature of chucking/heating process, the rise of the substrate temperature can be very fast, such as up to about 30 degrees Celsius per second. Under such high heating rates, there may be a chance that not every portion of the wafer will be heated at the same rate, so that at certain point, the temperature difference within the substrate may reach a critical value (e.g., >75 degrees Celsius) which could cause the substrate (such as a semiconductor wafer) to crack. To prevent such failure, a preheat step may be implemented prior to substrate chucking. The preheat step may include flowing a non-reactive gas, such as nitrogen (N2) or helium (He), or the like, at a rate of about 400 sccm to about 4 liter per minute, for about 20 to about 60 seconds or more (such as about 50 seconds), at a pressure of about 1-10 Torr (such as about 8 Torr), while maintaining the electrostatic chuck heater at the desired temperature (such as about 400 degrees Celsius) with the substrate disposed on the surface of the electrostatic chuck but not chucked thereto. The preheat step facilitates bringing up the substrate temperature close to the electrostatic chuck temperature prior to chucking (for example to within about 150 degrees Celsius of a targeted temperature of the substrate), hence reducing the potential thermal shock to the substrate upon chucking the substrate. In some embodiments, when a low contact electrostatic chuck (e.g., an electrostatic chuck having up to about 5% contact area) is utilized to support the substrate, a backside gas may be utilized to preheat the wafer. In some embodiments, the substrate may be preheated prior to delivery into the process chamber, such as by contact or non-contact (e.g., lamp) methods.

In some embodiments, to control or maintain the temperature of the substrate 202 at a desired temperature, or within a desired temperature range, the backside of the substrate 202 may be exposed to a heat transfer gas. In typical nitridation processes, the heat transfer gas may be helium (He), or another inert gas, such as nitrogen ($N_2$). Unfortunately, due to surface roughness on the backside of the substrate 202, some heat transfer gas may leak into a processing volume of a nitridation reactor and affect the nitridation rate, composition of a nitridizing plasma, process uniformity, reactor pressure, or the like. The risk and/or amount of such leakage may be further increased by low pressures in the reactor. To limit at least some of the undesirable effects that may be caused by heat transfer gas leakage, a process gas (e.g., a gas utilized for processing the substrate during the inventive methods disclosed herein) may be used as the heat transfer gas. The process gas may be, for example, a nitrogen-containing gas such as nitrogen ($N_2$), ammonia ($NH_3$), or combinations thereof. Thus, leakage of the process gas being used as a heat transfer gas from the backside of the substrate 202 may have a limited or no effect on the nitridation process.

Optionally, prior to nitridation of the first layer 204, the process chamber may be pre-conditioned to reduce residual oxygen content in the processing volume. For example, residual oxygen content such as from moisture, water ($H_2O$) or the like may result in undesired parasitic oxidation of the substrate 202 or the first layer 204. To prevent this from happening, the interior of the process chamber (including the lid, sidewall, and pedestal or chuck) may be pre-conditioned with a pre-conditioning plasma formed from a pre-conditioning gas. The pre-conditioning gas may include, for example, an inert gas, hydrogen ($H_2$) and an inert gas, ammonia ($NH_3$), hydrogen (H2) and nitrogen ($N_2$), or any suitable gas and/or combination of gases that may be reactive with oxygen and/or oxygen-containing gases. In some embodiments, pre-conditioning may be performed prior to, or during, chucking (e.g., securing the substrate to the chuck). In some embodiments, pre-conditioning may be performed prior to heating the substrate, or prior to nitridation of the first layer 204.

Figure 2C:
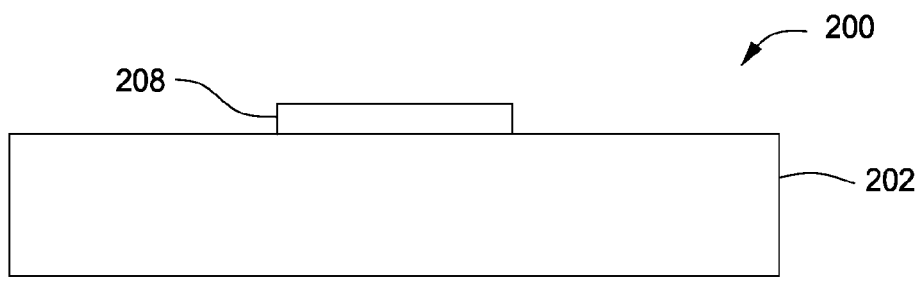
Figure 2D:
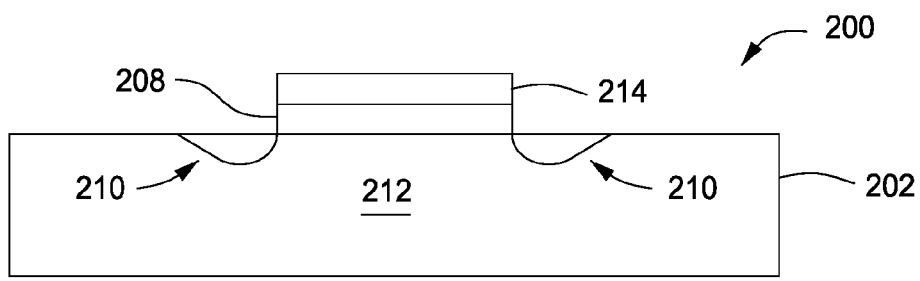

Next, at 106, the first layer 204 may be exposed to a radio frequency (RF) plasma formed from a process gas of a mixture of 0.5 percent ammonia ($NH_3$) with the balance being a noble gas, while maintaining the process chamber at a pressure of about 4 mTorr to about 1 Torr, or about 10 to about 80 mTorr, or about 10 mTorr to about 40 mTorr, or about 10 mTorr to about 20 mTorr to form a nitrogen-containing layer 208, as depicted in FIGS. 2C and 2D. For example, in some embodiments, the process gas may be ammonia ($NH_3$) or a mixture of ammonia ($NH_3$) and a noble gas wherein the mixture contains at least 0.5 percent of ammonia ($NH_3$). The noble gas may be, for example, argon (Ar), helium (He), krypton (Kr), or the like. In some embodiments, the process gas comprises ammonia ($NH_3$) and argon (Ar). In some embodiments, the process gas may consist only of ammonia and the noble gas. In some embodiments, the process gas may be predominantly comprised of or may consist essentially of ammonia and the noble gas.

In some embodiments, the process gas may be supplied at a total gas flow from about 100 to about 1000 sccm, or at about 400 sccm (although other flow rates may be used depending upon the application and configuration of the process chamber). In some embodiments, the process gas may comprise about 10- 100 percent $NH_3$ (e.g., an $NH_3$ flow of between about 10 - 1000 sccm). In some embodiments, the process gas may comprise about 0.5 - 99 percent $NH_3$ (e.g., an flow of between about 0.5 - 990 sccm) with the balance being essentially a noble gas, for example, argon (Ar) (e.g., a noble gas percentage of about 1 to about 99.5 percent). In some embodiments, the process gas may be about 0.5 - 15 percent $NH_3$ (e.g., an $NH_3$ flow of between about 5 - 150 sccm) with the balance being essentially a noble gas, such as argon (e.g., an inert gas percentage of about 85 to about 99.5 percent). In some embodiments, the process gas may be about 0.5 - 10 percent $NH_3$ (e.g., an $NH_3$ flow of between about 5 - 100 sccm) with the balance being essentially a noble gas, such as argon (e.g., an inert gas percentage of about 90 to about 99.5 percent). In some embodiments, the process gas may be about 1 - 5 percent $NH_3$ (e.g., an $NH_3$ flow of between about 5 - 100 sccm) with the balance being essentially a noble gas, such as argon (e.g., an inert gas percentage of about 95 to about 99 percent). In some embodiments, the process gas may be about 2.5 percent of $NH_3$ (e.g., an $NH_3$ flow of about 25 sccm when 1000 sccm total gas flow is provided) with the balance being essentially an inert gas, such as a noble gas, for example, argon (e.g., an inert gas percentage of about 97.5 percent).

The use of $NH_3$ in the process gas advantageously provides NH radicals for gate oxide nitridation. The inventors have observed that nitridation of SiON film using a $NH_3$—Ar process gas advantageously provides lower leakage current compared to traditional $N_2$ plasma nitridation processes.

Moreover, the inventors have observed that variations in the $NH_3$ percentage in a $NH_3$—Ar process gas mixture results in changes in H radical concentrations in the resulting plasma. For example, in some embodiments, the inventors have discovered that a decrease of $NH_3$ in the process gas from 20% to 2.5% results in an approximately 50% decrease in the concentration of H radicals in the plasma. The decrease in concentration of H radicals, which can react with chamber parts such as aluminum anodization layers, advantageously minimizes damage to the process tool. However, it was unexpectedly discovered that such a dramatic decrease in the amount of $NH_3$ provided, while significantly lowering the concentration of H radicals in the plasma, did not significantly alter nitridation levels of the process. As such, the inventors have unexpectedly discovered that the amount of ammonia used during the process can be lowered to advantageously minimize damage to the process tool while substantially retaining process performance and throughput.

The process gas may be introduced into a plasma reactor, for example, the plasma reactor 300, and used to form a plasma. In some embodiments, the plasma density may be about $10^{10}$ to about $10^{12}$ ions/$cm^3$. The plasma may be formed by using an RF source power. In some embodiments, the RF source power is up to about 5000 Watts. The RF source power may be provided at any suitable RF frequency. For example, in some embodiments, the RF source power may be provided at a frequency about 2 to about 60 MHz.

The plasma 206 may be pulsed or continuously applied at up to about 5000 Watts. For example, the plasma 206 may applied continuously at up to about 5000 Watts for a duration of about 10 to about 240 seconds, or about 60 seconds. The duration may be adjusted (e.g., shortened) to limit damage to the device 200. Alternatively, the plasma 206 may be pulsed at a pulse frequency of about 4 kHz to about 15 kHz. The pulsed plasma may have a duty cycle of about 2% to about 70%, at up to 2000 watts peak power, where the duty cycle and/or RF source power may be adjusted to limit damage to the device 200. In some embodiments, the pulsed plasma may have a duty cycle of about 30% to about 70%, at up to 4000 Watts peak power, where the duty cycle and/or RF source power may be adjusted to limit damage to the device 200.

In some embodiments, the exposed surface of the substrate 202 may be at least partially covered with a sacrificial layer (not shown), such as a masking layer to prevent exposure to the plasma 206 (e.g., to limit exposure of the plasma to desired portions of the substrate 202 and/or the first layer 204). In some embodiments, a pressure in the plasma reactor may be up to about 80 mTorr, about 10 mTorr to about 80 mTorr, about 10 mTorr to about 40 mTorr, or about 10 to about 30 mTorr during the exposure of the first layer 204 to the plasma 206.

In some embodiments, the nitridation rate may be improved by applying an RF bias to the substrate 202. For example, about 20 to about 60 Watts of RF bias power may be applied at a frequency of about 2 MHz to about 60 MHz. Such low RF bias may facilitate improving nitridation rates without causing excessive ion bombardment on the device 200.

The nitrogen-containing layer 208 formed from exposure of the first layer 204 to the plasma 206 as discussed above may be, for example, utilized as a gate dielectric layer of a transistor device, a tunnel oxide layer in a flash memory device, a spacer layer atop a gate structure, in an inter-poly dielectric (IPD) layer of a flash memory device, or the like. The nitrogen-containing layer 208 may have a thickness of about 0.3 to about 10 nm. The nitrogen-containing layer 208 may have a nitrogen content of about 5 to about 35 atomic percent. The nitrogen-containing layer 208 may comprise an oxynitride layer, such as silicon oxide (SiON), hafnium oxynitride (HfON), nitridated hafnium silicate (HfSiON), or any suitable oxynitride layer used in a semiconductor device and requiring nitridation. The nitrogen-containing layer 208 need not be limited to an oxynitride layer, and other suitable layers may benefit from the inventive methods disclosed herein. For example, in other suitable embodiments, the nitrogen-containing layer 208 may include or may be replaced with SiCN or other silicon (Si) containing compounds, metal containing compounds such as titanium oxide or nitride, tantalum oxide or nitride, aluminum oxide or nitride, or the like.

Upon forming the nitrogen-containing layer 208, the process 200 generally ends and additional process steps (not shown) may be performed to complete fabrication of the semiconductor device 200 and/or other devices (not shown) on the substrate 202. For example, and as shown in FIG. 2D, a conducting layer 214, such as polysilicon or another suitable conducting material, such as a metal, may be deposited atop the nitrogen-containing layer 208 and configured as a control gate of the device 200. Additional process steps may include ion implantation to form source/drain regions 210 in the substrate 202 adjacent to the nitrogen-containing layer 208 and conducting layer 214. The source/drain regions 210 have a channel 212 disposed therebetween, where the nitrogen-containing layer 208 is disposed atop the channel 212. Using the inventive nitridation processes described herein gate leakage between the channel and the control gate is about 0.01 to about 1 Amp/cm$^2$ for a nitrogen-containing layer 208 having about 15 to about 30 atomic percent nitrogen content and a thickness of about 10 to about 20 angstroms.

Figure 3:
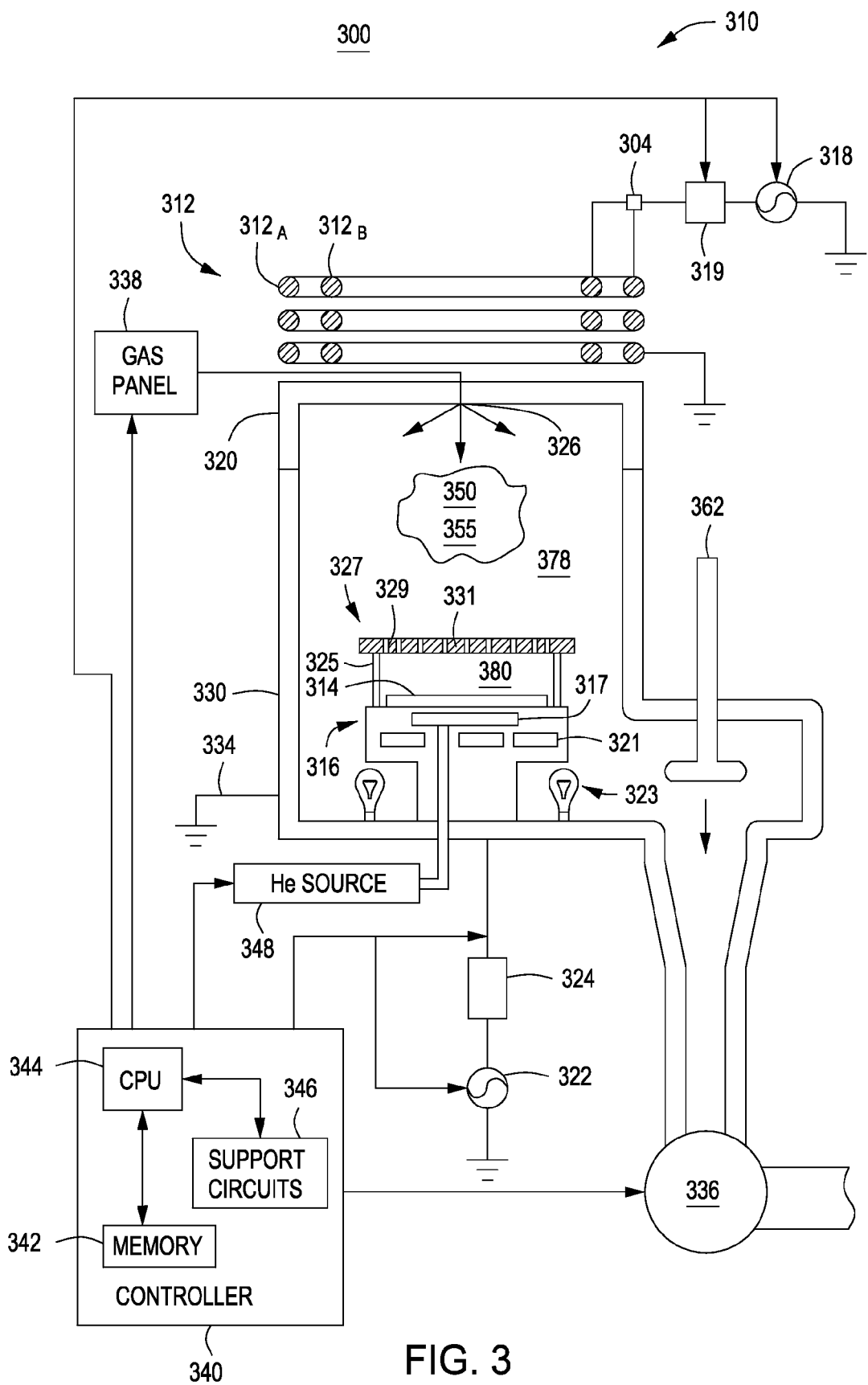
FIG. 3 depicts a plasma nitridation reactor suitable for use in accordance with some embodiments of the invention.

The inventive methods described herein, for example, the nitridation process 100 can be performed in a plasma reactor. For example, FIG. 3 depicts a schematic diagram of an inventive plasma reactor 300 adapted to be used to practice embodiments of the invention as discussed herein. The reactor 300 may be utilized alone or, more typically, as a processing module of an integrated semiconductor substrate processing system, or cluster tool, such as a CENTURA® DPN Gate Stack integrated semiconductor wafer processing system, available from Applied Materials, Inc. of Santa Clara, Calif.

The reactor 300 includes a process chamber 310 having a substrate support 316 disposed within a conductive body (wall) 330, and a controller 340. In some embodiments, the substrate support (cathode) 316 is coupled, through a first matching network 324, to a biasing power source 322. The biasing source 322 generally is a source of up to 500 W at a frequency of approximately 13.56 MHz that is capable of producing either continuous or pulsed power. In other embodiments, the source 322 may be a DC or pulsed DC source. In some embodiments, no bias power is provided.

In some embodiments, the process chamber 310 may include a liner (not shown) to line the inner surfaces of the process chamber 310. In some embodiments, the liner may be cooled, for example with coolant channels provided within the liner to flow a coolant therethrough. In some embodiments, the process chamber 310 (and other components exposed to plasma during processing) may be coated with a material that is resistant to the plasma. For example, in some embodiments, the process chamber 310 may be coated with a material that is resistant to attack from the plasma. In some embodiments, the coating may comprise a quartz, or a ceramic material, such as a yttrium oxide ($Y_2O_3$)-based ceramic compositions, aluminum oxide, or the like. In accordance with embodiments of the present invention, attack of chamber components from hydrogen radicals may advantageously be reduced during processing as described herein, while advantageously maintaining nitridation rates.

The chamber 310 may be supplied with a substantially flat dielectric ceiling 320. Other modifications of the chamber 310 may have other types of ceilings such as, for example, a dome-shaped ceiling or other shapes. At least one inductive coil antenna 312 is disposed above the ceiling 320 (dual co-axial antennas 312, including an outer coil $312_A$ and an inner coil $312_B$, are shown in FIG. 3). Each antenna 312 is coupled, through a second matching network 319, to a RF power source 318. The RF source 318 typically is capable of producing up to about 5000 W at a tunable frequency in a range from 2 MHz to 13.56 MHz, and which may produce either a continuous or pulsed plasma. Typically, the wall 330 may be coupled to an electrical ground 334.

In some embodiments, a power divider 304 may be disposed in the line coupling the outer coil $312_A$ and the inner coil $312_B$ to the RF power source 318. The power divider 304 may be utilized to control the amount of RF power provided to each antenna coil (thereby facilitating control of plasma characteristics in zones corresponding to the inner and outer coils). The dual coil antenna configuration may advantageously provide improved control of nitrogen dosage within each zone, such as to the first layer 204, as discussed above in the method 100.

Optionally, either and/or both of the antennas 312 may be tilted and/or raised lowered with respect to the ceiling 320. The change in position and/or angle of the antenna 312 may be utilized, for example, to change the characteristics, such as uniformity, of a plasma formed in the process chamber.

Further, and optionally, a plasma shield/filter may be included above the substrate support to provide improved control of, for example, nitridation of the first layer 204 as discussed above in the method 100. The plasma shield/filter may comprise a material, such as quartz, and may be grounded to the chamber 310 to remove ion species from the plasma formed in the process chamber. For example, an ion-radical shield 327 may be disposed in the chamber 310 above the substrate support 316. The ion-radical shield 327 is electrically isolated from the chamber walls 330 and the substrate support 316 and generally comprises a substantially flat plate 331 having a plurality of apertures 329. In the embodiment depicted in FIG. 3, the ion-radical shield 327 is supported in the chamber 310 above the pedestal by a plurality of legs 325. The apertures 329 define a desired open area in the surface of the ion-radical shield 327 that controls the quantity of ions that pass from a plasma formed in an upper process volume 378 of the process chamber 310 to a lower process volume 380 located between the ion-radical shield 327 and the substrate 314. The greater the open area, the more ions can pass through the ion-radical shield 327. As such, the size and distribution of the apertures 329, along with the thickness of the plate 331 controls the ion density in volume 380. Consequently, the shield 327 is an ion filter. One example of a suitable shield that may be adapted to benefit from the invention is described in U.S. patent application Ser. No. 10/882,084, filed Jun. 30, 2004 by Kumar, et al., and entitled "METHOD AND APPARATUS FOR PHOTOMASK PLASMA ETCHING," which is hereby incorporated by reference in its entirety. By changing the ion density near the wafer surface, one can control the ion/radical ratio, hence, possibly controlling the nitridation profile.

In some embodiments, the substrate support 316 may include a chucking device 317 for securing the substrate 314 to the support pedestal during processing. For example, the chucking device 317 may include an electrostatic chuck or a vacuum chuck. The chucking device 317 may facilitate improved heat transfer between the substrate 314 and one or more resistive heaters 321 disposed in the substrate support 316. As illustrated, the one or more resistive heaters 321 may be disposed in the substrate support 316 generally below the position of substrate 314 and configured in multiple zones to facilitate controlled heating of the substrate 314. In some embodiments, the substrate support 316 includes an electrostatic chuck and also includes one or more resistive heaters disposed within or beneath the electrostatic chuck. In some embodiments, the substrate support 316 may not include an electrostatic chuck, but may have one or more resistive heaters disposed proximate a support surface of the substrate support. In such embodiments, the substrate support having the resistive heaters may have a surface coating of, for example, aluminum nitride (e.g., the substrate support may be fabricated from, or may have an outer coating of, aluminum nitride or the like).

Figure 4:
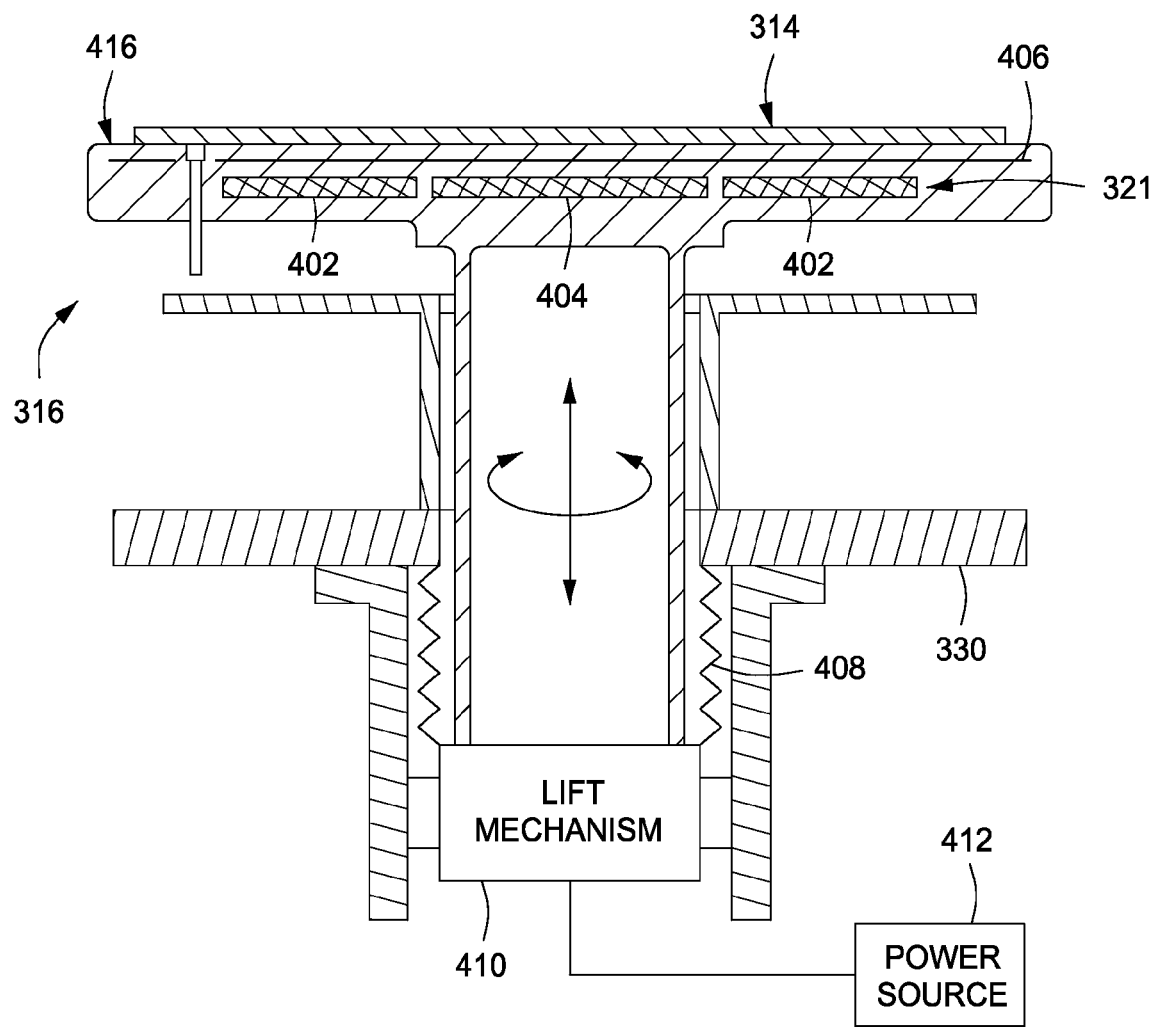
FIG. 4 depicts a substrate support suitable for use in a plasma nitridation reactor in accordance with some embodiments of the invention.

In some embodiments, the substrate support 316 may not have an electrostatic chuck and may include a resistive heater, such as shown in FIG. 4. The substrate support 316 depicted in FIG. 4 includes a resistive heater 321 configured to regulate the temperature of the substrate 314. The heater 321 may be include one or more zones (outer zone 402 and inner zone 404 depicted in FIG. 4). The heater 321 is coupled to a power source 412 and is capable of maintaining the substrate 314 at a temperature of up to about 500 degrees Celsius. In some embodiments a grounding mesh 406 may be disposed between the one or more heaters 321 and an upper surface 416 of the substrate support 316 to prevent the substrate 314 form sticking to the surface 416 of the substrate support 316. The inert coating discussed above may be also applied to the surface 416 of the substrate support 316.

In the case of using an electrostatic chuck with a heater, it has been demonstrated that the nitrogen dose and N % (e.g., the percentage of nitrogen by mass incorporated into the first layer 204 to form the nitrogen-containing layer 208) is directly proportional to the wafer temperature during the plasma process. So to control and/or tune the nitrogen dose and N % uniformity on the wafer, two approaches can be utilized: (1) fixed zone heating with a pre-designed pattern of power density for the heater elements so that the temperature uniformity pattern of the wafer compensates for the plasma uniformity pattern; or (2) tunable multiple zone heating with tunable power supplies for different heater zones (typically center and edge dual zones, but more zones may be utilized) so that the wafer temperature uniformity can be tuned to compensate for the plasma uniformity pattern. In either approach, temperature may be utilized as a knob to achieve improved within-wafer nitridation uniformity and/or providing a desired nitrogen dose pattern in the substrate. In some embodiments, the nitrogen dose pattern may be substantially uniform (e.g., within about 1 percent).

A motion assembly 410 may be provided to control the elevation of the substrate support 316, and therefore, of the substrate 314 during processing. The motion assembly 410 is sealingly coupled to the chamber body 330 using a flexible bellows 408. Alternatively or in combination, the motion assembly 410 may be configured to rotate the substrate support 316.

Returning to FIG. 3, alternatively or in combination, one or more radiative sources, such as lamps 323, may be provided to heat the substrate 314. The lamps 323 may be configured similar to radiative lamps utilized in rapid thermal processing chambers. Other heating methods or designs, including heating the substrate from above, may also be used.

The temperature of the substrate 314 may be controlled by stabilizing a temperature of the substrate support 316. A heat transfer gas from a gas source 348 is provided via a gas conduit 349 to channels formed by the back of the wafer 314 and grooves (not shown) in the support surface and/or chucking device 317. The heat transfer gas is used to facilitate heat transfer between the substrate support 316 and the substrate 314. During the processing, the substrate support 316 may be heated by the one or more resistive heaters 321 to a steady state temperature and then the heat transfer gas facilitates uniform heating of the substrate 314. Using such thermal control, the substrate 314 may be maintained at a temperature of about 0 to about 550 degrees Celsius.

In some embodiments, the substrate support 316 may have a low thermal mass for example, to prevent thermal shock to the substrate die to rapid cooling. For example, the substrate support 316 may be configured without a heat sink or cooling plate coupled thereto, thereby limiting the rate at which heat may be removed from the substrate support 316.

During a typical operation, the substrate 314 (e.g., the substrate 202) may be placed on the substrate support 316 and process gases are supplied from a gas panel 338 through an entry port 326 disposed in the ceiling 320 and centered above the substrate 314. In some embodiments, the gas panel 338 is configured to supply process gases such as ammonia ($NH_3$) or hydrogen ($H_2$). The process gases may be combined with additional gases, for example, nitrogen ($N_2$), helium (He) or argon (Ar) and flowed into the chamber 310 via the entry port 326. The entry port 326 may include, for example, a baffle or similar gas inlet apparatus that can provide a process gas perpendicularly towards the substrate 314 and radially onward into the process chamber 310. Upon entering the process chamber 310 via the entry port 326, the process gases form a gaseous mixture 350. The gaseous mixture 350 is ignited into a plasma 355 in the chamber 310 by applying power from the RF source 318 to the antenna 312. Optionally, power from the bias source 322 may be also provided to the substrate support 316. The pressure within the interior of the chamber 310 is controlled using a throttle valve 362 and a vacuum pump 336. The temperature of the chamber wall 330 is controlled using liquid-containing conduits (not shown) that run through the wall 330.

The controller 340 comprises a central processing unit (CPU) 344, a memory 342, and support circuits 346 for the CPU 344 and facilitates control of the components of the nitridation process chamber 310 and, as such, of nitridation processes, such as discussed herein. The controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method may be stored in the memory 342 as software routine and may be executed or invoked in the manner described above. The software routine may also be stored and/or executed by a second CPU (not shown) that is remotely located from the hardware being controlled by the CPU 344.

Thus, methods and apparatus for forming nitrogen-containing layers have been provided herein. The inventive methods and apparatus may advantageously provide improved nitridation of a target layer (e.g., a first layer) by facilitating increased nitrogen content with reduced layer thickening, and improved oxygen retention at an interface between the target layer and another device layer, for example, a polysilicon gate.

While the foregoing is directed to embodiments of the present invention, other and further embodiments of the invention may be devised without departing from the basic scope thereof.

The invention claimed is:

1. A method of forming a nitrogen-containing layer on a substrate disposed on a substrate support in a process chamber, comprising:
    exposing a first layer of a 3-dimensional FINFET substrate structure to a radio frequency (RF) plasma formed from a process gas comprising predominantly a mixture of ammonia ($NH_3$) and a noble gas, wherein ammonia is about 2.5 percent of the process gas and the noble gas is predominantly the balance;
    maintaining the substrate at a temperature of about 350 degrees Celsius to about 450 degrees Celsius while exposing the first layer to the RF plasma; and
    maintaining the process chamber at a pressure of about 10 mTorr to about 80 mTorr while exposing the first layer to the RF plasma to transform at least an upper portion of the first layer into a nitrogen-containing layer.

2. The method of claim 1, further comprising:
    exposing the first layer to a second plasma formed from a non-reactive gas prior to exposing the first layer to the RF plasma formed from the process gas; and
    securing the substrate to the substrate support using an electrostatic chuck or a vacuum chuck while exposing the first layer to the second plasma.

3. The method of claim 2, further comprising:
    preheating the substrate prior to securing the substrate to the substrate support.

4. The method of claim 3, wherein preheating the substrate further comprises:
    preheating the substrate to a temperature within at least about 150 degrees Celsius of a targeted temperature of the substrate at a pressure of about 8 Torr for a duration of at least about 50 seconds.

5. The method of claim 2, further comprising:
    heating the substrate to provide a non-uniform temperature profile to the first layer;
    wherein the RF plasma has a non-uniform plasma profile and wherein the non-uniform temperature profile is selected to compensate for the non-uniform plasma profile.

6. The method of claim 1, wherein the process gas consists of ammonia ($NH_3$) and the noble gas.

7. The method of claim 1, wherein the process gas consists essentially of ammonia ($NH_3$) and the noble gas.

8. The method of claim 1, wherein the process gas is about 2.5 percent ammonia ($NH_3$) and about 97.5 percent the noble gas.

9. The method of claim 1, wherein the first layer includes hafnium oxide ($HfO_2$), hafnium silicate ($HfSiO_x$), a first sub-layer of $SiO_2$ and a second sub-layer of $HfO_2$, or a first sub-layer of $SiO_2$ and a second sub-layer of $HfSiO_x$, and wherein the nitrogen-containing layer comprises hafnium oxynitride (HfON), or nitridized hafnium silicate (HfSiON).

10. The method of claim 1, further comprising:
    exposing the first layer to a pre-conditioning plasma formed from a pre-conditioning gas, wherein the pre-conditioning gas reduces residual oxygen content in the process chamber.

11. The method of claim 10, wherein the pre-conditioning gas includes an inert gas, hydrogen ($H_2$) and an inert gas, or ammonia ($NH_3$).

12. The method of claim 1, wherein the substrate support comprises an electrostatic chuck having a heater, and wherein heating the substrate further comprises heating the substrate to a temperature of about 350 to about 450 degrees Celsius using the heater while securing the substrate to the substrate support using the electrostatic chuck.

13. The method of claim 1, further comprising:
    applying an RF bias to a substrate having the 3-dimensional substrate structure disposed thereon.

14. The method of claim 1, wherein the nitrogen-containing layer has a nitrogen content of about 5 to about 35 atomic percent.

15. A method of forming a nitrogen-containing layer on a substrate disposed in a process chamber, comprising:
    exposing a first layer of a 3-dimensional substrate structure to a radio frequency (RF) plasma formed from a process gas comprising predominantly a mixture of ammonia ($NH_3$) and a noble gas, wherein ammonia is about 2.5 percent of the process gas and the noble gas is predominantly the balance; and
    maintaining the process chamber at a pressure of about 10 mTorr to about 80 mTorr while exposing the first layer to the RF plasma to transform at least an upper portion of the first layer into a nitrogen-containing layer.

16. The method of claim 15, wherein the 3-dimensional substrate structure is a 3-dimensional FINFET substrate structure.

* * * * *